United States Patent [19]

Merchant

[11] Patent Number: 5,362,979
[45] Date of Patent: Nov. 8, 1994

[54] SOI TRANSISTOR WITH IMPROVED SOURCE-HIGH PERFORMANCE

[75] Inventor: Steven L. Merchant, Yorktown Heights, N.Y.

[73] Assignee: Philips Electronics North America Corporation, New York, N.Y.

[21] Appl. No.: 105,213

[22] Filed: Aug. 10, 1993

Related U.S. Application Data

[63] Continuation-in-part of Ser. No. 101,164, Aug. 3, 1993, and a continuation of Ser. No. 811,554, Dec. 20, 1991, Pat. No. 5,246,878, which is a continuation-in-part of Ser. No. 650,391, Feb. 1, 1991, Pat. No. 5,300,448.

[51] Int. Cl.$^5$ ............... H01L 29/68; H01L 29/78
[52] U.S. Cl. ................... 257/340; 257/347; 257/409
[58] Field of Search ............ 257/347, 348, 350, 66, 257/401, 409, 57, 349, 365, 340

[56] References Cited

U.S. PATENT DOCUMENTS

| | | | |
|---|---|---|---|
| 4,437,225 | 3/1984 | Mizutani | 257/66 |
| 5,124,768 | 6/1992 | Mano et al. | 257/347 |

FOREIGN PATENT DOCUMENTS

| | | | |
|---|---|---|---|
| 56-19673 | 2/1981 | Japan | 257/409 |
| 63-76379 | 4/1988 | Japan | 257/349 |

*Primary Examiner*—Sara W. Crane
*Assistant Examiner*—Donald L. Monin, Jr.
*Attorney, Agent, or Firm*—Paul R. Miller

[57] ABSTRACT

The present application is directed to an improved arrangement for a thin silicon SOI transistor having improved source-high performance especially for bridge type circuits. This structure prevents forward current saturation during such source-high operations, and is made by forming the laterally extending silicon layer with a region of thinner thickness over ⅓ to ⅔ of the length of the drift region, or the lateral linear doping region. The field plate is formed with a separation from the gate electrode, and only extends over the thinned portion of the drift region. The gate electrode and field plate are short-circuited by a metal interconnect.

5 Claims, 4 Drawing Sheets

SOI TRANSISTOR WITH IMPROVED SOURCE-HIGH PERFORMANCE

The present application is a continuation-in-part of Ser. No. 08/101,164, filed Aug. 3, 1993, and a continuation of Ser. No. 07/811,554, filed Dec. 20, 1991, now U.S. Pat. No. 5,246,878, which is a continuation-in-part of previous U.S. patent application Ser. No. 07/650,391, filed Feb. 1, 1991, now U.S. Pat. No. 5,300,448.

The new invention of the present application involves a further improvement of the structure and method for making high-voltage, thin-film transistors of the silicon-on-insulator (SOI) type, such as set forth in the previous applications. In particular, the present application emphasizes a structure which prevents forward current saturation during source-high operation of the SOI device. This is achieved by forming only a thin silicon layer above the lateral linear doping region of the SOI device over a length of ⅓ to ⅔ of the drift region, and separating the field plate of the gate region from the gate electrode, so that the field plate extends only over the thinned portion of the drift region of the linear lateral doping region of the silicon layer.

BACKGROUND OF THE INVENTION

A major problem in high voltage integrated circuit technology is to find a satisfactory solution for the problem of isolation of components and sub-circuit sections. A solution to this problem was found in previous application Ser. No. 07/650,391, filed Feb. 1, 1991, now U.S. Pat. No. 5,300,448, where the present inventor was a co-inventor, in which a drift region of a lateral linear doping profile was formed in the silicon layer of a SOI device. The silicon layer was provided as a thin layer of silicon having a thickness of about 2,000 to 3,000 angstroms. A SOI semiconductor device having this structure results in a semiconductor having a high breakdown voltage characteristic.

Such basic structure suffers from problems occurring from external electrical fields acting on the drift region, such as those caused by moisture or other contaminants on the surface of the wafer. Further, this prior structure has a higher device on-resistance than necessary.

In order to prevent these problems in the original application, it was found that by forming a gate region having a field plate extending from the gate electrode laterally over the thinned silicon layer with an intervening upper oxide layer a significant improvement of the original structure occurs. This improvement is present in previous applications, Ser. No. 07/811,554, filed Dec. 20, 1991, now U.S. Pat. No. 5,246,878, and application Ser. No. 08/101,164, filed Aug. 3, 1993, and is seen with the intervening upper oxide layer above the silicon-on-insulator layer having the same thickness as the buried oxide layer below the silicon-on-insulator layer. The source and drain regions are formed at opposite sides of the SOI layer.

The benefit of this previous structure is the ability to deplete the drift region from both the top and bottom so that twice the conducting charge may be placed in the drift region. This lowers the on-resistance of the device.

Thus, for this structure, as may be seen in FIG. 1 of the present application, which corresponds to the previous applications, the thin buried oxide layer 2 has a thickness ranging from 1 to 3 micron, and the intervening upper oxide layer 6 also has a thickness ranging from 1 to 3 micron. For this structure, a high breakdown voltage ranging from 500–900 V is achieved where the drift region 4 of the silicon layer 1 is very thin, i.e., 0.1–0.4 microns.

In addition, the previous arrangement, as seen in FIG. 1, provides the drift region 4 with a linear lateral doping region, as set forth in U.S. Pat. No. 5,300,448. The polysilicon gate electrode 13 and field plate 7 form the gate region 13, 7 where the gate electrode 13 is separated from the silicon layer 1 by a thin gate oxide 8. The SOI device includes source and drain regions 10 of n+ conductivity at opposite sides of the silicon layer 1. The source region also includes a p+ source layer 11 so that the source contact 12 contacts both source layers 10 and 11. The source region is formed on a p-body 9. Electrical contacts 12 contact each of the source region, drain region, and gate electrode 13.

The problem with this design, however, is low forward current saturation in the source-high configuration, such as encountered in bridge circuits. When the source is allowed to float to the high potential, the forward current is small, because the SOI layer becomes depleted of electrons. This depletion is more pronounced toward the left side of the drift region because the doping concentration is smaller there.

SUMMARY OF THE INVENTION

The present invention solves these problems by thinning the silicon layer of the SOI device only over about ⅓ to ⅔ of the drift region. Moreover, the field plate extending over drift region is separated from the gate electrode, and only extends over the thinned portion of the silicon layer.

This new structure provides SOI circuitry that enables the reverse voltage characteristics to remain virtually the same as in the devices of the previous applications, while the forward voltage characteristics in the source-high configuration encountered in a bridge circuit provide only a slight forward current saturation, whereas the forward current in the previous devices decreases drastically with negative substrate voltage.

BRIEF DESCRIPTION OF THE DRAWING FIGURES

The invention is more clearly described in detail by way of example with reference to the drawing figures, in which:

FIG. 1 illustrates in cross-section the arrangement U.S. Pat. No. 5,246,878 and Ser. No. 08/101,164, filed Aug. 3, 1993;

Figure 1:
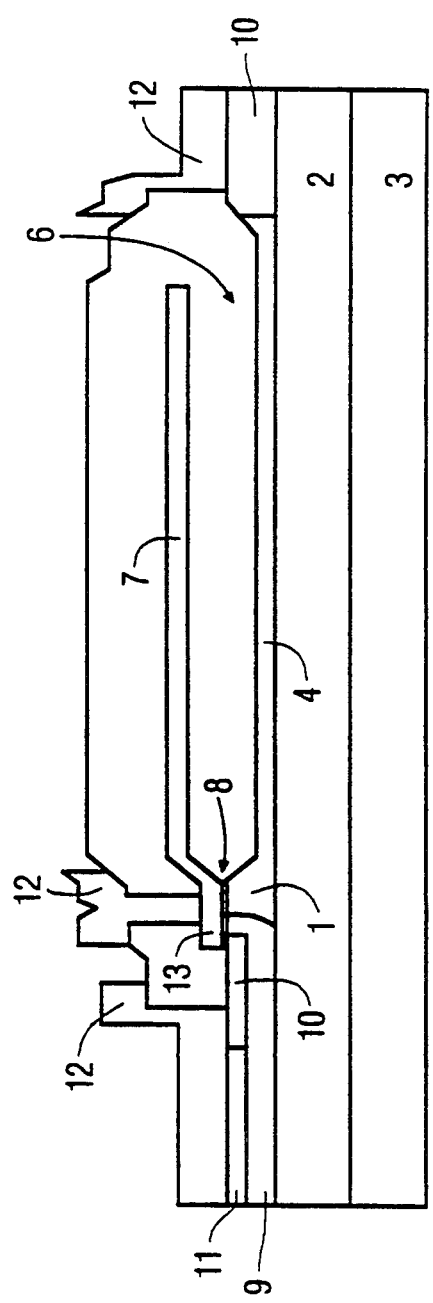
Figure 2:
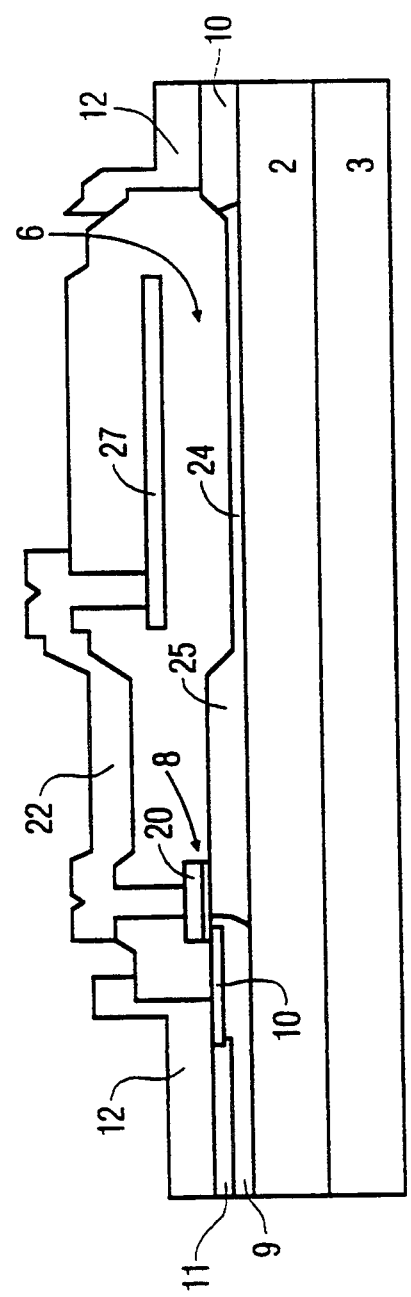
FIG. 2 illustrates in cross-section the improved arrangement of a thin film SOI transistor according to the present invention.

The same reference numerals are maintained in FIGS. 1 and 2 for the same features.

DESCRIPTION OF THE INVENTION

The improved arrangement of the present invention prevents forward current saturation during source-high operation, such as occurs with bridge circuits. This is achieved according to the present invention by thinning the silicon layer 24, 25 in FIG. 2 only over a portion 24 of about ⅓ to ⅔ of the length of the drift region providing the lateral linear doping region of the SOI device. The left side portion 25 of the silicon layer remains at a higher thickness, such as about 1 to 2 micron, while the right side portion 24 has been thinned to about 0.1–0.4 microns.

The polysilicon gate electrode 20 is also separated from the polysilicon field plate 27. A metal interconnect 22 of a material such as aluminum is used to short-circuit these polysilicon electrode layers, and to act as a metal field plate over the thicker left side portion 25 of the silicon layer. The intermediate upper oxide layer 6 between the portion 24 and the field plate 27 also extends between the metal interconnect 22 and the left portion 25 of the silicon layer at the same thickness as the buried oxide layer 2.

Figure 2A:
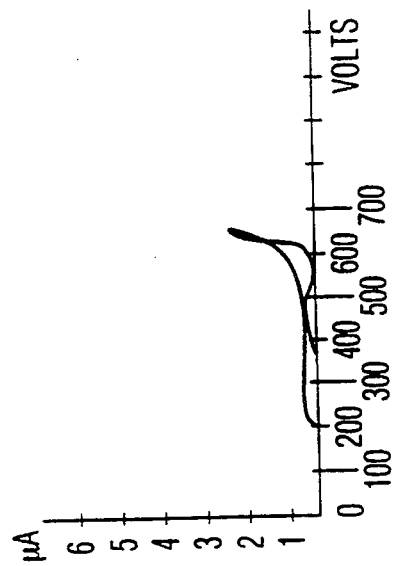
FIGS. 2a and 2b illustrate a comparison of the reverse characteristics of the device of FIG. 1 and the device FIG. 2, respectively.
Figure 2B:
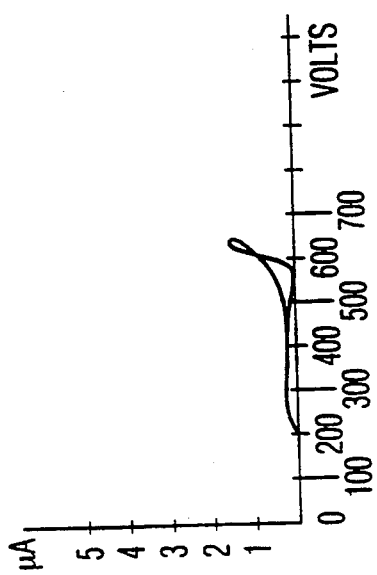

This new device has been fabricated in the same manner as the devices of the previous applications. In this respect, FIGS. 2a and 2b show the reverse characteristics of such a previous device as that in FIG. 1 and the new device of the present invention shown in FIG. 2, respectively. Identical breakdown voltages of about 620 volts were achieved for both devices.

Figure 3B:
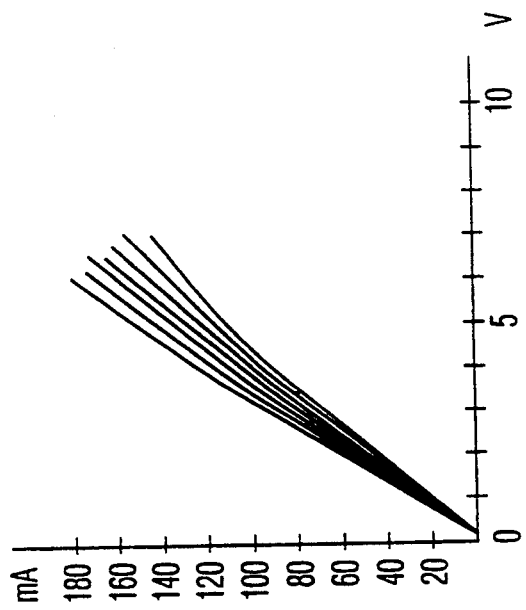
FIGS. 3a and 3b show the forward characteristics of the previous device and the present new device, respectively.
Figure 3A:
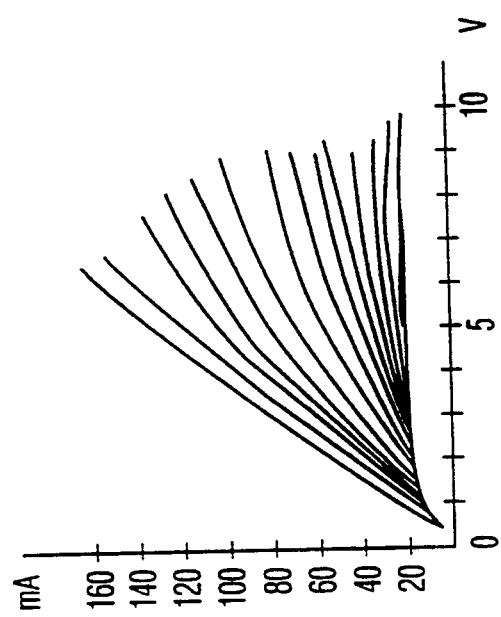

On the other hand, FIGS. 3a and 3b show the forward characteristics of the previous and present SOI devices, respectively. In both cases, the substrate was biased from 0 to −200 volts in steps of −1 volt. This test is representative of the source-high configuration used in bridge circuits. The forward current in the previous device decreases drastically with negative substrate voltage resulting in a high forward current saturation. The improved structure of the present application provides a device showing only a slight forward current saturation.

As an alternative in the arrangement of the present invention, the n+ drain region 10 may be replaced by a thin p+ drain in order to make a LIGBT circuit device. In this case, however, the p+ drain is then placed on an n buffer layer.

What I claim:

1. A thin film SOI device having improved source-high performance characteristics comprising the structure of a buried oxide layer; a layer of silicon on said buried oxide layer, said layer of silicon having a laterally extending region of both a first thickness and a second smaller thickness; a second oxide layer on said layer of silicon; a gate electrode above a a portion of said first thickness of said layer of silicon; a drain region laterally adjacent to said second smaller thickness of said layer of silicon; a source region laterally separated from said gate electrode; a field plate separate from said gate electrode and extending laterally over said second smaller thickness of said layer of silicon, and means for short-circuiting said gate electrode and said field plate.

2. A thin film SOI device according to claim 1, wherein said second smaller thickness extends over about ⅓ to ⅔ of said laterally extending region of said layer of silicon.

3. A thin film SOI device according to claim 1, wherein said second smaller thickness has a thickness of 0.1–0.4 μm.

4. A thin film SOI device according to claim 1, wherein said first thickness of said layer of silicon is about 1–2 μm.

5. A thin film SOI device according to claim 1, wherein both said gate electrode and said field plate are polysilicon, and said means for short-circuiting is conductive metal extending over said second oxide layer.

* * * * *